United States Patent [19]

Fujimoto et al.

[11] Patent Number: 5,571,778
[45] Date of Patent: Nov. 5, 1996

[54] SUPERCONDUCTING JUNCTION MATERIAL AND PROCESS OF PREPARING SAME

[75] Inventors: Manabu Fujimoto, Osaka; Katsumi Suzuki, Tokyo; Youichi Enomoto, Tokyo; Shoji Tanaka, Tokyo, all of Japan

[73] Assignees: Superconductivity Research Laboratory of International Superconductivity Technology Center; Sharp Corporation, both of Japan

[21] Appl. No.: 413,999

[22] Filed: Mar. 30, 1995

[30] Foreign Application Priority Data

Apr. 1, 1994 [JP] Japan .................... 6-065077

[51] Int. Cl.$^6$ .................... B44C 1/22; B05D 5/00
[52] U.S. Cl. .................... 505/329; 505/410; 505/728; 216/3
[58] Field of Search .................... 505/190, 329, 505/410, 411, 412, 413, 728, 816, 820; 216/3, 55, 66; 437/910

[56] References Cited

U.S. PATENT DOCUMENTS 5,262,395  11/1993  Ginley et al. .................... 505/855
5,356,870  10/1994  Fujiwara et al. .................... 505/410 X

FOREIGN PATENT DOCUMENTS 0325765  8/1989  European Pat. Off. .
0364101  4/1990  European Pat. Off. .

OTHER PUBLICATIONS

Patent Abstracts of Japan vol. 014, No. 461 5 Oct. 1990.

Applied Physics letters, 28 Feb. 1994, vol. 64, No. 9 pp. 1153–1155.

*Primary Examiner*—William Powell
*Attorney, Agent, or Firm*—Lorusso & Loud

[57] ABSTRACT

A superconductor junction material is disclosed which comprises a substrate of a single crystal, and at least flux flow element, and optionally at least one Josephson junction element, provided on the surface, each of the flux flow and Josephson junction elements being formed of a superconducting oxide layer having a weak link. The flux flow and Josephson junction elements are prepared by vacuum deposition at different oxygen partial pressures.

9 Claims, 5 Drawing Sheets 5,571,778

SUPERCONDUCTING JUNCTION MATERIAL AND PROCESS OF PREPARING SAME

BACKGROUND OF THE INVENTION

This invention relates to a superconductor junction material having an oxide substrate provided with one or more flux flow elements and, optionally, one or more Josephson junction elements and to a process for the production thereof.

In application of superconductors to electronic devices, it is very important to produce Josephson junctions with a large IcRn product. Because high Tc oxide superconductors have layered crystal structures and short coherent lengths, it is very difficult to produce Josephson junctions of a laminate type. Thus, the recent trend in the fabrication of Josephson junctions is toward the formation of grain boundary on a substrate.

Gross, R. et al propose the use of a substrate which is a laminate of two single crystal layers (Phys. Rev. Lett., 64, 228 (1990)). Dary, K. et al propose the use of a substrate having a stepped portion (Appl. Phys. Lett., 58, 543 (1991)). These methods, which utilize the difference in crystal orientations of the superconductors on both sides of the link, are not satisfactory because of the poor reproducibility of the Josephson junction characteristics, a small IcRn product and difficulty in forming the link at a desired position.

Neumann, C. et al propose a YBaCuO Josephson junctions produced by a method in which a YBaCuO film is grown on a MgO substrate which has been damaged with a focused Ga-ion beam to form a weak link (Jpn. J. Appl. Phys., 32, No. 2, L727–L729 1993) and Physica C, 210, 138–146 (1993)). This method permits the formation of a Josephson junction on a desired area on a substrate with good reproducibility and with a high degree of precision.

SUMMARY OF THE INVENTION

It is an object of the present invention to provide a junction material having one or more flux flow elements and, optionally, one or more Josephson junction elements on the same substrate of a single crystal.

Another object of the present invention is to provide a junction material of the above-mentioned type which is useful as a one-chip device having both a sensor and a transistor.

It is a further object of the present invention to provide a simple process which can produce, with good reproducibility, a junction material having one or more flux flow elements and, optionally, one or more Josephson junction elements on a single crystal substrate.

In accomplishing the foregoing objects, the present invention provides a superconductor junction material comprising a substrate of a single crystal having a substantially flat surface, at least one Josephson junction element provided on said surface, and at least one flux flow element provided on said surface, each of said Josephson junction and flux flow elements being formed of a superconducting oxide layer having a weak link.

In another aspect, the present invention provides a superconductor junction material comprising a substrate of a single crystal having a substantially flat surface, at least one flux flow element provided on said surface, said flux flow element being formed of a superconducting oxide layer having a weak link.

The present invention the present invention also provides a process for the production of a superconducting junction material, comprising the steps of:

(a) irradiating a surface of a single crystal substrate with a focused ion beam to form at least two damaged portions;

(b) then forming a first superconducting oxide layer by vacuum deposition on said surface;

(c) then selectively removing a predetermined part of said first superconducting layer to expose part of said surface together with at least one of said damaged portions and to leave at least one first pattern of said first superconducting layer intersecting at least one of the other damaged portions;

(d) then forming a second superconducting oxide layer by vacuum deposition on said exposed surface including said exposed damaged portion; and (e) then selectively removing a predetermined part of said second superconducting layer to leave at least one second pattern of said second superconducting layer intersecting at least one exposed damaged portion, steps (b) and (d) being carried out at different oxygen partial pressures so that either one of said first and second sections forms a Josephson junction element having a weak link just above the corresponding damaged portion with the other section forming a flux flow junction element having a weak link just above the corresponding damaged portion.

The present invention further provides a process for the production of a superconducting junction material, comprising the steps of:

(a) irradiating a surface of a single crystal substrate with a focused ion beam to form at least one damaged portion;

(b) then forming a superconducting oxide layer by vacuum deposition on said surface at an oxygen partial pressure of higher than 150 mTorr but not higher than 200 mTorr; and (c) then selectively removing a predetermined part of said superconducting layer to expose part of said surface and to leave at least one pattern of said superconducting layer intersecting said damaged portion, thereby to obtain a flux flow junction element having said pattern in which a weak link is formed just above said damaged portion.

The present invention further provides superconductor junction materials obtained by the above methods.

BRIEF DESCRIPTION OF THE DRAWINGS

Other objects, features and advantages of the present invention will become apparent from the detailed description of the preferred embodiments which follows, when considered in light of the accompanying drawings in which.

DETAILED DESCRIPTION OF THE PREFERRED EMBODIMENTS OF THE INVENTION

Figure 1:
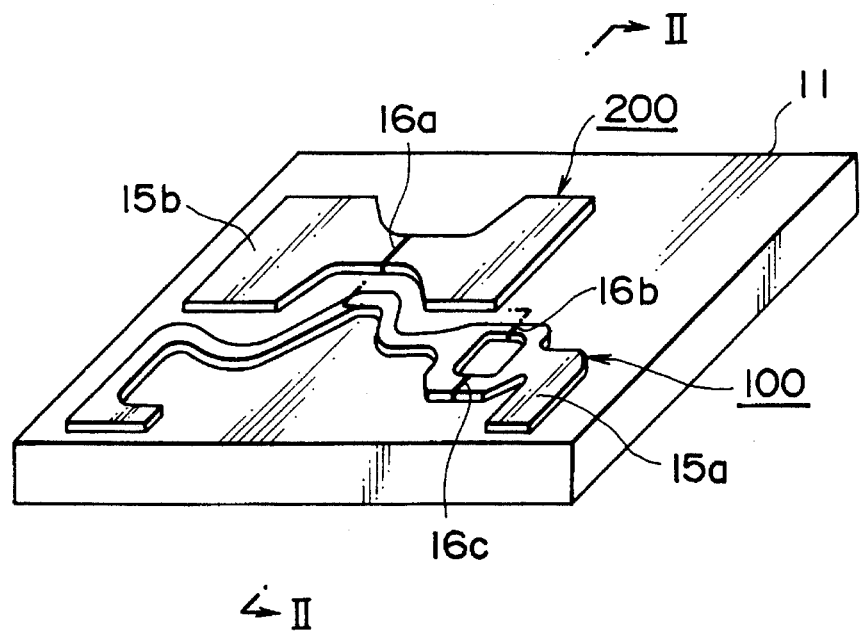
FIG. 1 is a perspective view schematically showing a junction material according to the present invention.

FIG. 1 schematically depicts an example of a junction material according to the present invention. Designated as 11 is a substrate of a single crystal such as MgO, $SrTiO_3$, $NdGaO_3$, $LaAlO_3$ or $LaGaO_3$. If desired, a mixed crystal of one or more of these single crystals may be used. It is important that the substrate 11 have a substantially flat surface. The term "substantially flat surface" used herein is intended to refer to such a surface that a superconductive layer provided thereon has crystal orientation substantially equal throughout that surface. Thus, the presence of small grooves or steps in a surface of the substrate 1 is permissive for the purpose of the present invention as long as the crystal orientation of a superconductor layer provided on that surface is substantially unvaried over the surface.

Provided on the surface of the substrate 11 are a Josephson junction element 100 and a flux flow element 200. The Josephson junction element 100 is formed of a first superconductive oxide layer 15a having weak links 16b abd 16c and is utilized, in the illustrated embodiment, as a highly sensitive sensor such as for detecting magneticity, light or a high frequency wave. The flux flow element 200 is formed of a second superconductive oxide layer 15b having a weak link 16a and is utilized as a transistor.

One preferred embodiment of the fabrication of the junction material of FIG. 1 will be described with reference to FIGS. 2(a)–2(e).

Figure 2A:
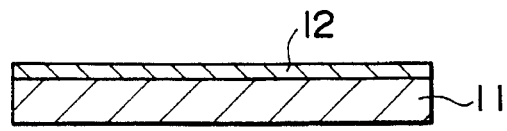
FIGS. 2(a)–2(g) are sectional views explanatory of process steps for the fabrication of the junction material of FIG. 1.

As shown in FIG. 2(a), the substrate 11 is first coated with a normal metal, such as Au, Pd or Pt, to form a protecting layer 12 over the flat surface thereof. The formation of the protecting layer 12 may be suitably performed by vacuum deposition. The protecting layer 12 generally has a thickness of 0.01–0.4 μm, preferably 0.02–0.2 μm.

Figure 2B:
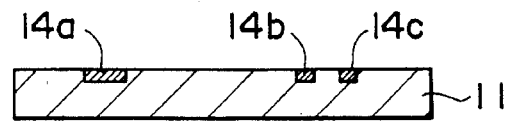

The coated substrate 11 is then irradiated with a focused ion beam at any desired position so that the irradiated portion of the protecting layer 12 is etched and removed and damaged portions 14a–14c are defined in the substrate 1 at the desired position, as shown in FIG. 2(b). The damaged portions 14a–14c contain the implanted ion and serves to form weak links as described hereinafter.

The focused ion beam is preferably $Ga^+$ ion beam. The beam diameter is preferably in the range of 10–100 nm and the beam current is in the range of 1 pA–60 nA. Because of the presence of the protecting layer 12, the scattering of the ion can be minimized so that the width of the damaged portions 14a–14c can be maintained as small as 300 nm or less. The protecting layer 12 also serves to prevent the formation of a large trench in the substrate 11. Each of the damaged portions 14a–14c is of a flat type and the depth thereof is generally not greater than 100 nm.

After the completion of the ion beam irradiation, the protecting layer 12 is completely removed from the substrate 11 as shown in FIG. 2(b). For this purpose, an argon ion milling method or a wet method using an aqueous solution containing KI and I is suitable for reasons of prevention of adverse affection on the substrate 11.

Figure 2C:
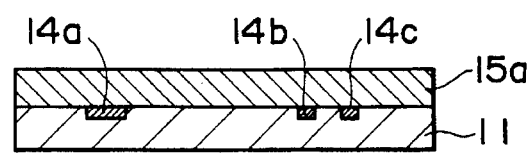

A first layer 15a of an oxide superconductor is then formed by vacuum deposition on the surface of the substrate 11 from which the protecting layer 12 has been removed and which bears the damaged portions 14a–14c (FIG. 2(c)). Since those portions of the superconductor layer 15a that are located just above the damaged portions 14a–14c are grown under an influence of the damaged portions, the crystallinity of those portions is disturbed, so that weak links 16a–16c are defined in the superconducting layer 15 at positions just above the damaged portions 14a–14c, respectively.

The oxide superconductor is preferably a YBaCuO superconductor, such as $YBa_2Cu_3O_{7-x}$ or $YBa_2Cu_4O_{8-x}$. The thickness of the superconductor layer 15a is generally in the range of 0.05–0.6 μm, preferably 0.1–0.4 μm. The formation of the superconductor layer 15a may be performed by a pulse laser deposition method, a magnetron sputtering method or like conventional method at a specific, first oxygen partial pressure as described hereinafter. It is preferred that the deposition of the superconductor layer 15a be performed while maintaining the temperature of the substrate 11 at 720°–800° C., more preferably 740°–790° C., for reasons of obtaining a desired superconducting oxide crystal film.

Figure 2D:
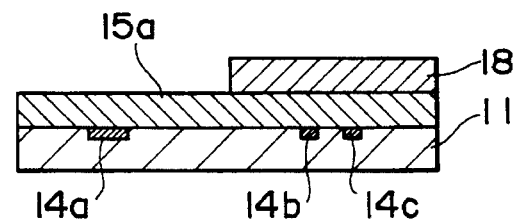
Figure 2E:
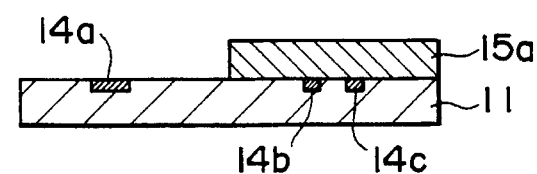

The superconductor layer 15a is then overlaid with a photoresist mask 18 (FIG. 2(d)) and patterned by, for example, photolithography and dry etching with argon ion or chemical etching, thereby to form a pattern 15a (FIG. 1 and FIG. 2(e)) which intersects the damaged portions 14b and 14c. Thus, a Josephson junction element 100 having weak links 16b and 16c is formed on the substrate 11.

Figure 2F:
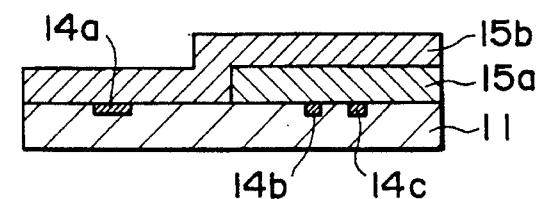

Next, a second, oxide superconductor layer 15b is formed on the substrate 11 bearing the Josephson junction element 100 in the same manner as in the formation of the first superconductor layer 15a except that a different, second oxygen partial pressure is used as described hereinafter (FIG. 2(f)).

Figure 2G:
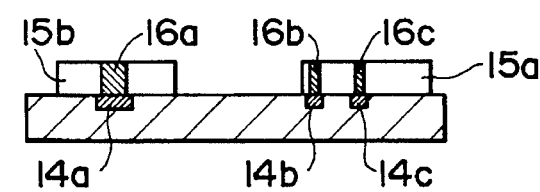

The second superconductor layer 15b is then subjected to photolithography and patterning in the same manner as described above to form a pattern 15b (FIG. 1 and FIG. 2(g)) which intersects the damaged portions 14a. Thus, a flux flow element 200 having weak links 16a is formed on the substrate 11.

It has been unexpectedly found that the junction characteristics can be controlled by control of the oxygen partial pressure at which the vacuum deposition of an oxide superconductor on a damaged portion-bearing substrate is performed and that a Josephson junction element and a flux flow element can be selectively obtained at different oxygen partial pressures.

Thus, when the oxygen partial pressure (the first pressure in the above embodiment) is not greater than 150 mTorr, preferably between 75–150 mTorr, more preferably 100–145 mTorr, a Josephson junction is formed on the substrate. On the other hand, a flux flow element is obtained when the oxygen partial pressure (the second pressure in the above embodiment) is greater than 150 mTorr, preferably between 155–300 mTorr, more preferably 155–200 mTorr. The flux flow element is distinguished from the Josephson junction element in that a magnetic flux which has penetrated into the weak link of the former element can flow therethrough, whereas a magnetic flux which has penetrated into the weak link of the latter element is pinned thereat.

In the foregoing embodiment, only one Josephson junction element 100 and only one flux flow junction are described as formed on the substrate 11 for sake of simplicity. It is without saying that any desired number of such elements can be formed on a single substrate in the same manner as above. Further, the formation of the Josephson junction elements may be preceded by the formation of the flux flow element. The oxide superconductor layer 15a may be formed of an oxide superconductor having a composition which is the same as or different from that of the layer 15b.

The following example will further illustrate the present invention.

Reference Example 1

Figure 3:
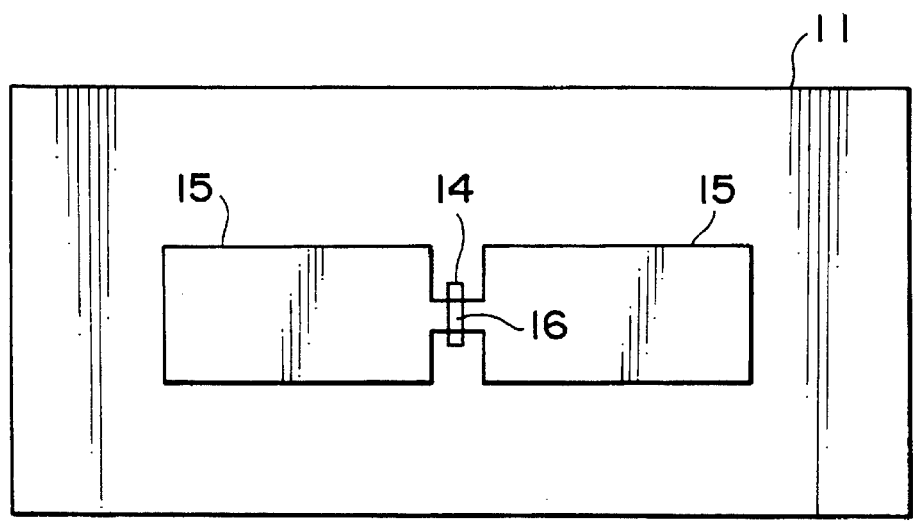
FIG. 3 is a plan view diagrammatically showing a Josephson junction prepared in Reference Example 1.

Fabrication of Josephson Junction Element:

A Josephson junction element as shown in FIG. 3 was prepared. One surface of a single crystal MgO (100) substrate 11 was coated with Au by vacuum deposition at $10^{-6}$ mTorr to form a protecting layer of Au having a thickness of about 100 nm. This was then disposed in a focused ion beam apparatus and was irradiated, in a micro area of 0.1 μm×20 μm, with focused $Ga^+$ ion beam at an acceleration voltage of 30 KeV and a beam current of 1 pA so that there was formed a damaged portion 14 into which Ga infiltrated and which had a shallow groove with a depth of 40–80 nm. The Au layer was then removed by chemical etching with a solution obtained by dissolving 4 g of KI and 1 g of I in 150 g of distilled water.

A $YBa_2Cu_3O_{7-x}$ was then deposited on the substrate 11 by a pulse laser deposition method at an oxygen partial pressure of 100 mTorr and a substrate temperature of 770° C. to form a YBaCuO superconductor layer 15 having a thickness of 300 nm. The YBaCuO layer 15 was deposited under the influence of the damaged portion 14 of the substrate 11 so that the crystallinity of that portion of the YBaCuO layer 15 positioned just above the damaged portion 14 was disturbed. The YBaCuO layer 15 was then patterned by photolithography and dry etching with argon ion to form a pattern as shown in FIG. 3 composed of two electrode sections each having a width of 1 mm and a length of 5 mm and a linking section which had a width of 5 μm and a length of 30 μm and which was intersected by the damaged portion 14. The intersecting region of the YBaCuO pattern represents a weak link 16 of the thus obtained Josephson junction element.

Figure 4:
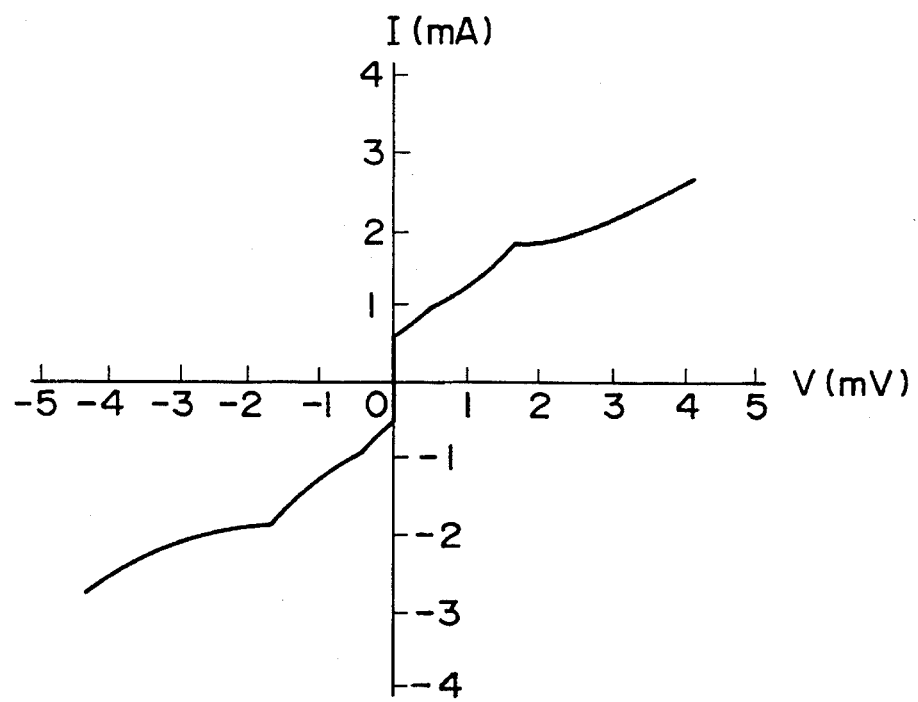
FIG. 4 is a graph showing current/voltage characteristics of the Josephson junction in Reference Example 1 without microwave irradiation.
Figure 5:
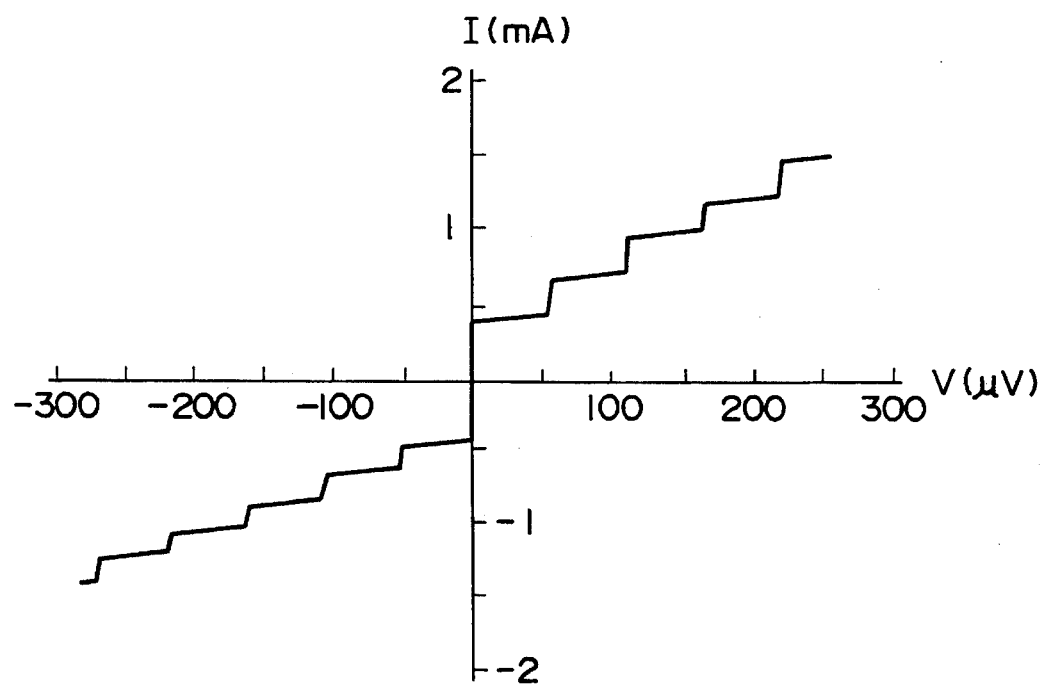
FIG. 5 is a graph showing current/voltage characteristics of the Josephson junction in Reference Example 1 with microwave irradiation.
Figure 6:
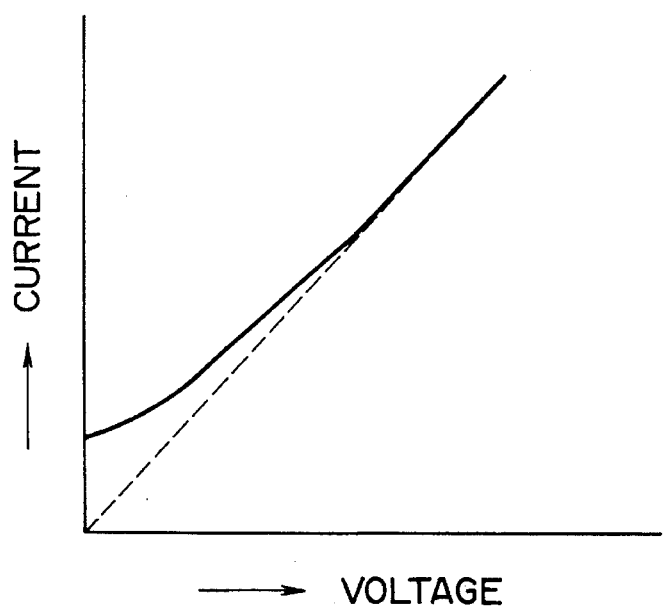
FIG. 6 is a graph showing current/voltage characteristics of the Josephson junction in Reference Example 1 in accordance with the RSJ model.

FIG. 4 shows voltage-current characteristics of the above Josephson junction element at 14 K without microwave irradiation, while FIG. 5 shows Shapiro step characteristics of the above Josephson junction element measured at 15 K with a strong microwave irradiation of 25 GHz. A Josephson junction may be explained by a resistively shunted junction (RSJ) model in which a distributed capacity, a quasiparticle conductance and a nonlinear Josephson junction element are connected in parallel. FIG. 6 shows voltage-current characteristics of the above Josephson junction, from which it will be noted that the curve is downwardly convex and, thus, is of a RSJ type. From the results shown in FIGS. 5 and 6, it will be appreciated that the Josephson junction thus formed exhibits excellent performance.

Example 1

Fabrication of Flux Flow Element:

Reference Example 1 was repeated in the same manner as described except that the deposition of the YBaCuO layer was performed at an oxygen partial pressure of 200 mTorr.

Figure 7:
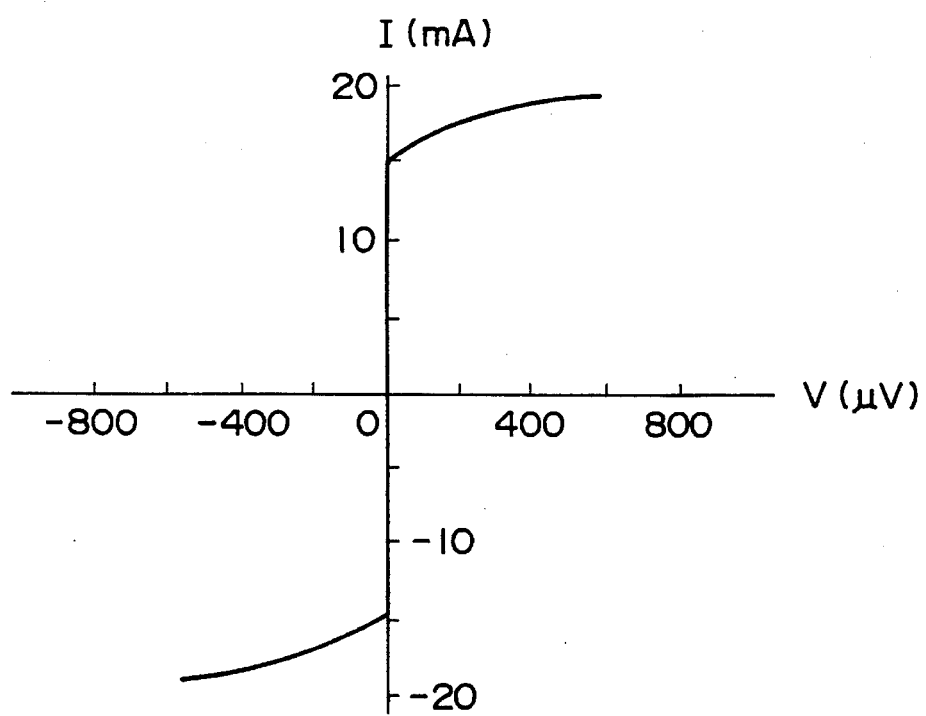
FIG. 7 is a graph showing current/voltage characteristics of the flux flow element obtained in Example 1.

The thus obtained oxide superconductor junction element showed voltage-current characteristics as shown in FIG. 7. The curve is upwardly convex in the plus voltage region, suggesting that the element is of a flux flow type rather than a Josephson junction type.

The above procedure was repeated in the same manner as described at various oxygen partial pressures of 50, 75 and 155 mTorr. At 75 mTorr, a Josephson junction element was obtained. At 155 mTorr, a flux flow element was obtained.

Figure 8:
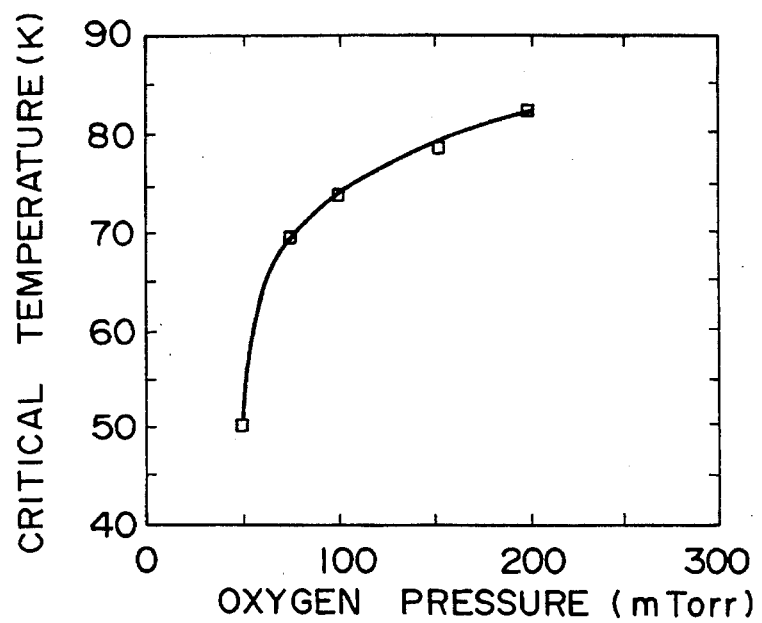
FIG. 8 is a graph showing a relationship between the critical temperature of an element and the oxygen partial pressure at which the YBaCuO film of the element has been formed.
Figure 9:
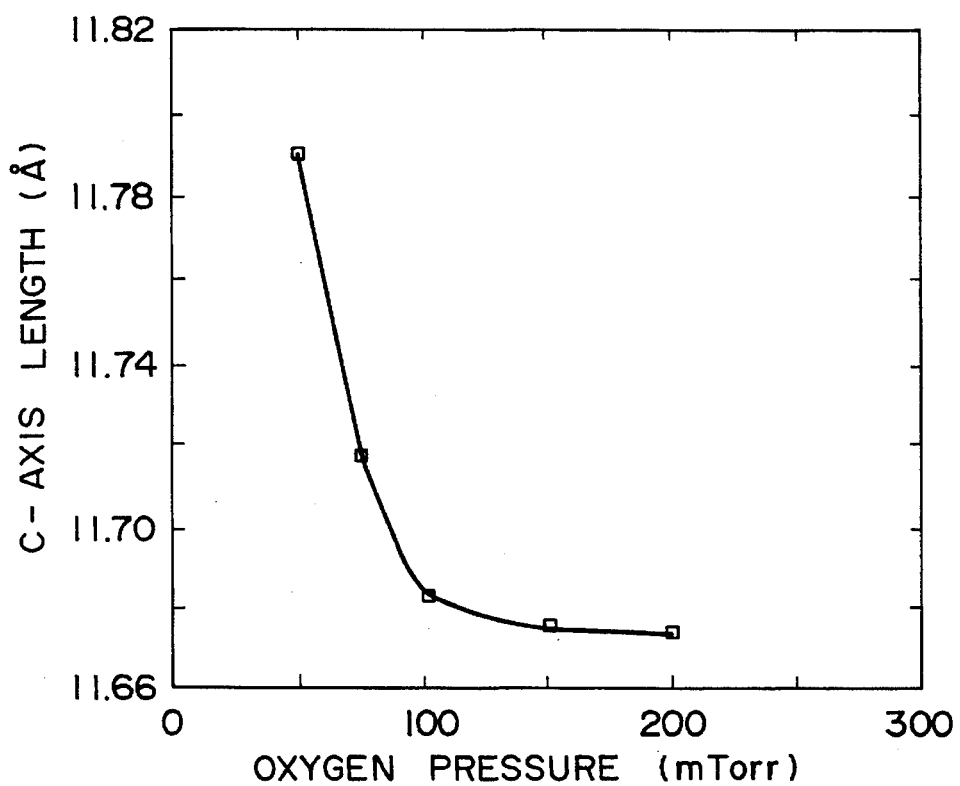
FIG. 9 is a graph showing a relationship between the c-axis length of a YBaCuO film and the oxygen partial pressure at which the film has been formed.

FIGS. 8 and 9 show oxygen partial pressure dependence of the critical temperature and c-axis length, respectively. With an oxygen partial pressure of 50 mTorr, the critical temperature is significantly lowered with the simultaneous increase of the c-axis length.

Example 2

Fabrication of Superconductor Junction Material Having Josephson Junction Element and Flux Flow Element:

A superconductor junction element having a Josephson junction element 100 and a flux flow element 200 as shown in FIG. 1 was prepared. One surface of a single crystal MgO (100) substrate 11 was coated with Au by vacuum deposition at $10^{-6}$ mTorr to form a protecting layer of Au having a thickness of about 100 nm. This was then disposed in a focused ion beam apparatus and was irradiated, in a micro area of 0.1 μm×20 μm, with focused $Ga^+$ ion beam at an acceleration voltage of 30 KeV and a beam current of 1 pA so that there were formed damaged portion 14a–14c into each of which Ga infiltrated and each of which had a shallow groove with a depth of 40–80 nm. The Au layer was then removed by chemical etching with a solution obtained by dissolving 4 g of KI and 1 g of I in 150 g of distilled water.

A $YBa_2Cu_3O_{7-x}$ oxide was then deposited on the substrate 11 by a pulse laser deposition method at an oxygen partial pressure of 100 mTorr and a substrate temperature of 770° C. to form a YBaCuO superconductor layer having a thickness of 300 nm. The YBaCuO layer was deposited under the influence of the damaged portions 14a–14c of the substrate 11 so that the crystallinity of those portions of the YBaCuO layer positioned just above the damaged portions 14a–14c was disturbed. The YBaCuO layer was then patterned by photolithography and dry etching with argon ion to form a pattern 15a having weak links 16b and 16c each having a width of 5 μm and a length of 30 μm and each located just above the damaged portions 14b and 14c.

A $YBa_2Cu_3O_{7-x}$ oxide was then deposited on the substrate 11 by a pulse laser deposition method at an oxygen partial pressure of 200 mTorr and a substrate temperature of 770° C. to form a YBaCuO superconductor layer having a thickness of 300 nm. The YBaCuO layer was then patterned by photolithography and dry etching with argon ion to form a pattern 15b having weak link 16a which had a width of 5 μm and a length of 30 μm and which was located just above the damaged portions 14a.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

We claim:

1. A process for the production of a superconducting junction material, comprising the steps of:

(a) irradiating a surface of a single crystal substrate with a focused ion beam to form at least two damaged portions;

(b) then forming a first superconducting oxide layer by vacuum deposition on said surface;

(c) then selectively removing a part of said first superconducting layer to expose part of said surface together with at least one of said damaged portions and to leave at least one first pattern of said first superconducting layer intersecting at least one of the other damaged portions;

(d) then forming a second superconducting oxide layer by vacuum deposition on said exposed surface including said exposed damaged portion; and (e) then selectively removing a part of said second superconducting layer to leave at least one second pattern of said second superconducting layer intersecting at least one exposed damaged portion, steps (b) and (d) being carried out at different oxygen partial pressures so that either one of said first and second sections forms a Josephson junction element having a weak link just above the corresponding damaged portion with the other section forming a flux flow junction element having a weak link just above the corresponding damaged portion.

2. A process as claimed in claim 1, wherein step (b) is performed at an oxygen partial pressure of not lower than 100 mTorr but not higher than 150 mTorr to form said Josephson junction element and step (d) is performed at an oxygen partial pressure of higher than 150 mTorr but not higher than 200 mTorr to form said flux flow element.

3. A process as set forth in claim 1, wherein before step (a) said surface is coated with a gold layer, said gold layer being removed before step (b).

4. A process as claimed in claim 1, wherein said focused ion beam is a $G^+$ ion beam.

5. A process as claimed in claim 1, wherein step (c) and (e) are by chemical etching or plasma etching.

6. A process as claimed in claim 1, wherein steps (b) and (d) are each performed by pulsed laser deposition at a substrate temperature of 720°–800° C.

7. A process for the production of a superconducting junction material, comprising the steps of:

(a) irradiating a surface of a single crystal substrate with a focused ion beam to form at least one damaged portion;

(b) then forming a superconducting oxide layer by vacuum deposition on said surface at an oxygen partial pressure of higher than 150 mTorr but not higher than 200 mTorr; and (c) then selectively removing a part of said superconducting layer to expose part of said surface and to leave at least one pattern of said superconducting layer intersecting said damaged portion, thereby to obtain a flux flow junction element having said pattern in which a weak link is formed just above said damaged portion.

8. A superconductor junction material obtained by a process according to claim 1.

9. A superconductor junction material obtained by a process according to claim 7.

* * * * *